United States Patent [19]
Berry, Jr.

[11] Patent Number: 6,006,345
[45] Date of Patent: Dec. 21, 1999

[54] PATTERN GENERATOR FOR MEMORY BURN-IN AND TEST

[75] Inventor: Robert W. Berry, Jr., Round Rock, Tex.

[73] Assignee: International Business Machines Corporation, Armonk, N.Y.

[21] Appl. No.: 08/853,597

[22] Filed: May 9, 1997

[51] Int. Cl.⁶ .................................................. G06F 11/00
[52] U.S. Cl. ............................................................ 714/718
[58] Field of Search .................................. 371/21.2, 21.3, 371/21.4, 21.6; 395/183.18; 365/201

[56] References Cited

U.S. PATENT DOCUMENTS 5,506,959  4/1996  Cockburn ................................. 395/183
5,606,520  2/1997  Gove et al. .............................. 364/746

*Primary Examiner*—Vincent P. Canney
*Attorney, Agent, or Firm*—Sawyer & Associates; Casimer K. Salys

[57] ABSTRACT

A system and method for testing of a memory during burn-in is disclosed. In one aspect, the method and system include an address generator. The address generator includes a shift register means. The shift register includes n bit positions. The n bit positions are for storing n bits. The n bits are capable of being in a plurality of patterns. The address generator further includes a counter coupled to the shift register means. The counter includes a value that is incremented in response to a particular pattern of the plurality of patterns. The address generator has a complement mechanism coupled to the shift register and the counter which provides a complement of at least a portion of the n bits stored in the n bit positions in response to the value in the counter. In another aspect, the method and system comprise the address generator previously discussed coupled to the memory undergoing testing. In this aspect, the method and system further have a data generator coupled to the address generator and the memory and compare circuitry coupled to the memory and the data generator. In this aspect, a fail is detected when data from the data generator does not match data stored in the memory.

32 Claims, 4 Drawing Sheets

PATTERN GENERATOR FOR MEMORY BURN-IN AND TEST

FIELD OF THE INVENTION

The present invention relates to a method and system for dynamic or in situ memory burn-in and testing and more particularly to a method and system for implementing memory burn-in and testing which provides a significantly greater variety of test sequences while requiring relatively little additional circuitry.

BACKGROUND OF THE INVENTION

During dynamic or in situ memory burn-in, the memory is tested. Typically, a memory burn-in runs for approximately eight to twenty-four hours. In order to test the memory, conventional systems utilize a test sequence which is repeated many times over this period.

For example, some conventional systems use a deterministic data generator to provide predetermined data for testing. In such conventional systems, a simple counter is typically used to generate addresses of the cells to be tested. Consequently, the test sequence is repeated many times. These conventional systems compare the data generated to the data from the memory. If the two do not match, an error has occurred.

The conventional system could also use a read modified write test. The test writes data, reads the data, and writes the complement of the data to the same address. The test then reads the data and moves to the next address. This test determines whether every cell can write to a one or zero and if each address is unique. However, the test does not detect certain fails due to a particular unusual configuration. For example, when a particular bit is set at zero but the adjacent bits are all one, the zero may flip to a one. As a result, such errors will go undetected.

Other conventional systems utilize a pair of linear feedback shift registers ("LFSR") to generate the addresses and the data. A multiple input shift register ("MISR") typically captures a unique signature for each pattern written to the memory. The MISR feeds back two of the data bits to an exclusive or ("XOR"), and uses the XOR as an input to one bit. The MISR also performs an XOR on each of the incoming and outgoing data bits. The MISR, therefore, captures a unique signature for each set of data. At the end of the memory burn-in, the final signature should match an expected signature. If the signatures do not match, an fail has occurred. In order to determine where the fail has occurred, further diagnosis is typically necessary.

A method akin to a binary search may be utilized to determine where the fail occurred. For example, if the signatures do not match at the end of the burn-in, half of the test may be run to determine if the signature correct half way through the burn in. If this signature matches what is expected, then one-fourth of a test is performed. This procedure continues until the fail is found. Thus, in order to determine where the error is, the data must be simulated to know what the MISR should read at the intervening points.

Although conventional systems provide testing in memory burn-in, only a limited number of address patterns are generated. Consequently, unusual patterns which may cause errors are not tested. In a system utilizing a MISR, additional steps are necessary to determine if an error has occurred and which pattern resulted in the error.

Accordingly, what is needed is a system and method for providing memory burn-in having a greater number of test patterns without a significant increase in circuitry. The present invention addresses such a need.

SUMMARY OF THE INVENTION

The present invention provides a method and system for providing testing during memory burn-in. In one aspect, the method and system comprise an address generator. The address generator comprises shift register means, counter means, and complement means. The shift register means include n bit positions. The n bit positions are for storing n bits. The n bits are capable of being in a plurality of patterns. The counter means are coupled to the shift register means. The counter means include a value that is incremented in response to a particular pattern of the plurality of patterns. The complement means are coupled to the shift register means and the counter means. The complement means provide a complement of at least a portion of the n bits stored in the n bit positions in response to the value in the counter means. In another aspect, the method and system comprise the address generator previously discussed coupled to the memory undergoing testing. In this aspect, the method and system further comprise a data generator coupled to the address generator and the memory, as well as compare circuitry coupled to the memory and the data generator. In this aspect, a fail is detected when data from the data generator does not match data stored in the memory.

According to the system and method disclosed herein, the present invention provides a significantly greater number of test patterns while using little additional hardware, thereby increasing overall system performance.

BRIEF DESCRIPTION OF THE DRAWINGS

FIG. 1a is a block diagram of one conventional system for providing testing during memory burn-in.

FIG. 1b is a is a block diagram of another conventional system for providing testing during memory burn-in.

FIG. 2 is a block diagram of one embodiment of the method and system for providing testing during memory burn-in.

DETAILED DESCRIPTION OF THE INVENTION

The present invention relates to an improvement in testing circuitry for memory burn-in or extended testing. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1A:
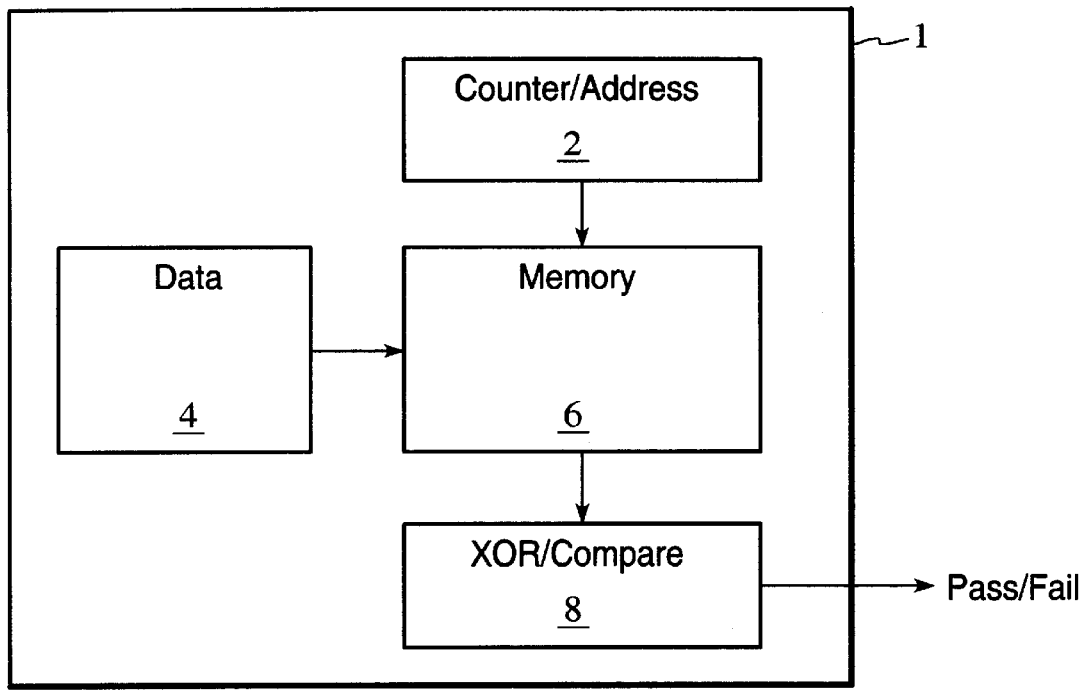

FIG. 1a is a block diagram of one conventional system 1 for performing testing during memory burn-in for the memory 6. The conventional system 1 uses a deterministic generator 4 to provide predetermined data. In the system 1, a simple counter 2 is used to generate addresses of the cells to be tested. The test sequence is repeated many times. As a result, only a limited number of patterns are tested. The compare hardware 8 compares the data generated to the data from the memory 6. If the two do not match, a fail has occurred, and a fail signal is generated.

Figure 1B:
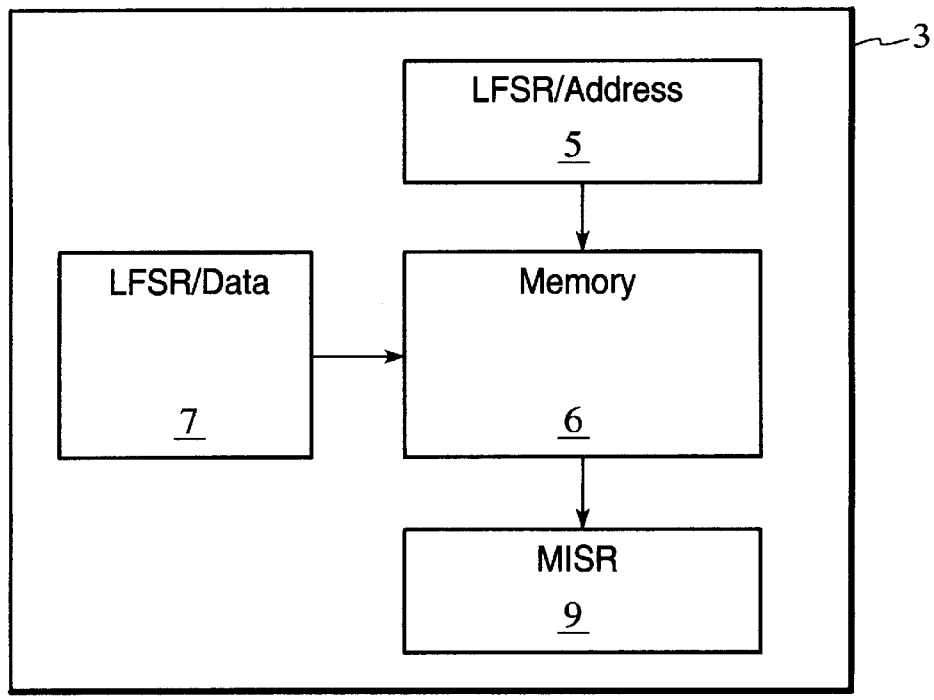

FIG. 1b is a block diagram of another conventional system 3 for performing testing during memory burn-in of the memory 6. The system 3 utilizes a linear feedback shift register ("LFSR") 5 or a pseudo random number generator to generate the addresses for the memory 6 undergoing testing. In some conventional systems, the LFSR 5 can also provide an all zeroes address. A second LFSR 7 generates the data. A multiple input shift register ("MISR") 9 captures a signature from the data stored in the memory 6.

The MISR 9 uses an exclusive or ("XOR") operation on two of the data bits as an input to the shift register. In addition, the MISR 9 feeds back each outgoing bit to an XOR with an incoming bit for the same bit position. Consequently, a unique signature is captured at each clock cycle. At the end of a run, the final signature should match an expected signature. If the signatures do not match, a fail has occurred. In order to determine how the fail occurred, further diagnosis is typically necessary. This diagnosis may relatively difficult.

Although the conventional systems shown in FIGS. 1a and 1b provide some testing during memory-burn in, those with ordinary skill in the art will realize that only a limited number of test patterns are generated. Consequently, unusual patterns which may cause errors are not tested.

One of ordinary skill in the art will also readily recognize that if conventional circuitry is employed, a great deal of additional hardware must be used to generate a significant number of extra test patterns. This large amount additional hardware is undesirable. Finally, the system 3 utilizing the MISR 9 requires additional steps to determine if a fail has occurred and which pattern caused the fail. The additional diagnosis required in the system 3 makes error detection more time consuming and difficult.

The present invention provides for a method and system for providing a significantly greater variety of patterns for testing in memory burn-in. The present invention will be described in terms of address and data generators utilizing four bits. However, one of ordinary skill in the art will readily recognize that this method and system will operate effectively for address and data generators using any number of bits.

Figure 2:
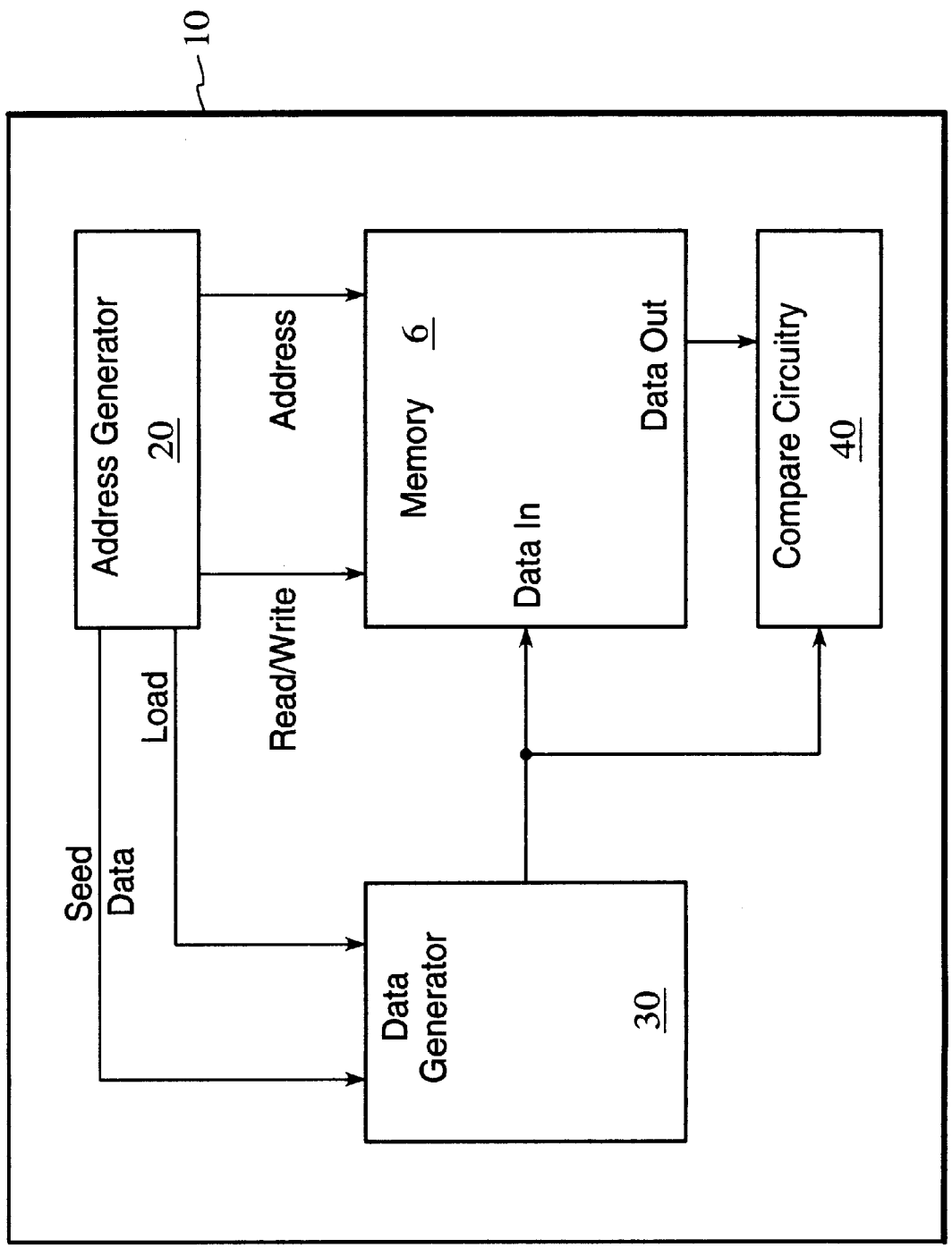

To more particularly illustrate the method and system in accordance with the present invention, refer now to FIG. 2 depicting a block diagram of one embodiment of a system 10 in accordance with the method and system.

The system 10 of the present invention provides testing for the memory 6. The system 10 includes an address generator 20 and a data generator 30. The address generator 20 provides a read/write signal as well as an address to the memory 6 being tested. The compare circuitry 40 compares the data input to the memory 6 from the data generator 30 to the data read from the memory 6. Where the data does not match, the compare circuitry 40 immediately provides a fail signal.

Figure 3:
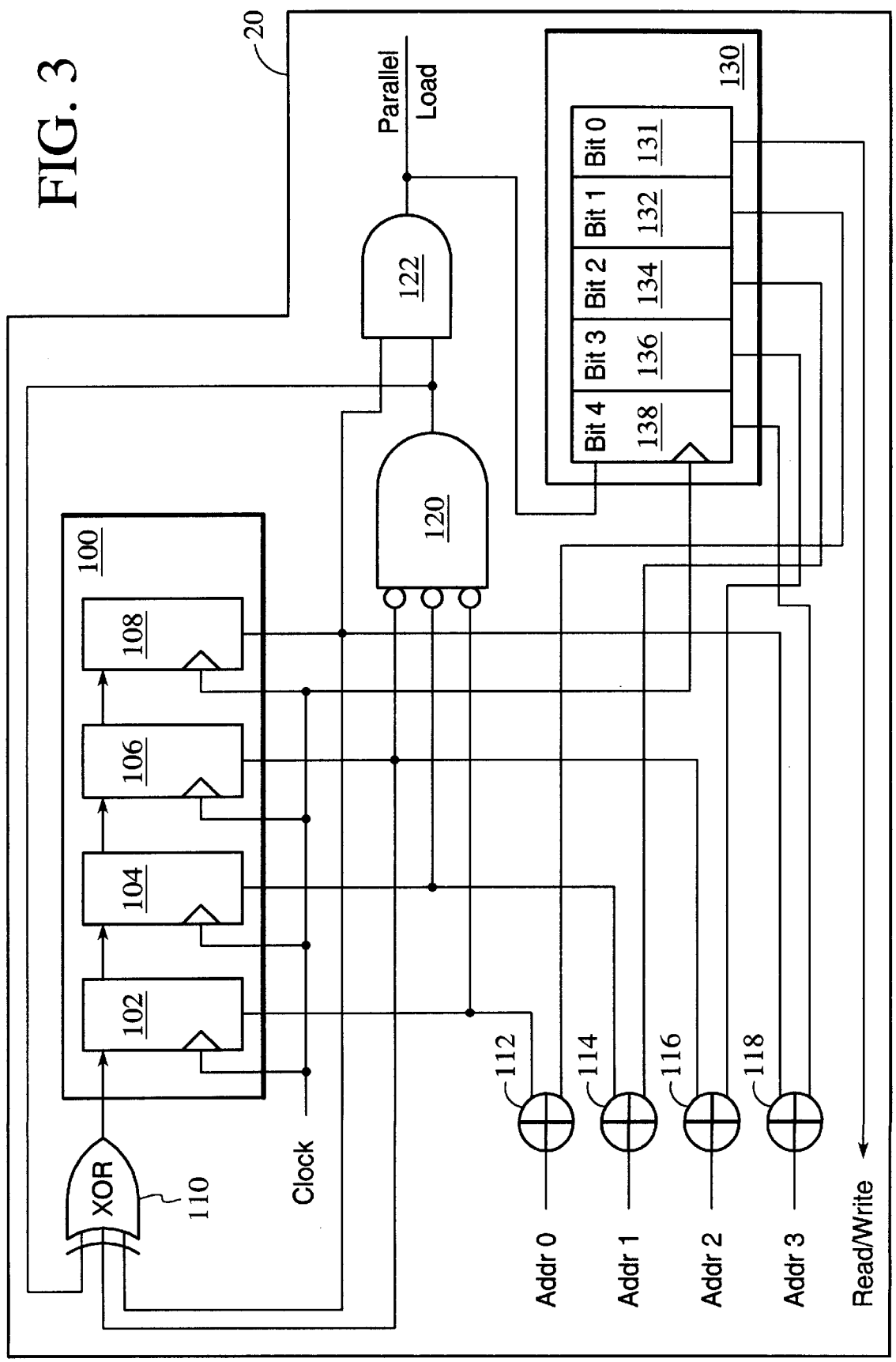
FIG. 3 is a diagram depicting one embodiment of an address generator in accordance with the method and system.

The address generator 20 of the system 10 provides a significantly greater variety of sequences of addresses without requiring a great deal of additional hardware. The address generator 20 includes an n bit shift register 100 and an (n+1) bit counter 130. The bit counter 130 has one bit more than the shift register 100 because the bit counter 130 also generates a read/write signal using bit zero 131. In the address generator 20 shown in FIG. 3, n is four. Thus, the shift register 100 is comprised of four bit positions: 102, 104, 106, and 108. The bit counter 130 holds five bits: bit zero 131, bit one 132, bit two 134, bit three 136, and bit four 138.

In each clock cycle, bits from the shift register 100 are shifted out of positions 102 through 108 to the bit position to the right, if a bit position to the right exists. The farthest right bit position could be either the most significant or least significant bit position, depending on how a user chooses to count. In addition, the bits are shifted from bit positions 102 through 108 to components 112 through 118, respectively.

An input to the farthest left bit position 102 of the shift register 100 is an XOR gate 110. In one embodiment, the bits from the two farthest right bit positions, 106 and 108, are fed back through XOR gate 110 to provide the input to the farthest left bit position 102. This feedback allows ($2^n-1$) of a possible $2^n$ combination of four bits to be generated by the shift register 100. Note that if n is another number, different bit positions may be fed back through XOR gate 110 to provide the ($2^n-1$) combinations. Thus, in the address generator 20 of FIG. 2, fifteen of a possible sixteen combinations of addresses are provided using a feedback of bit positions 106 and 108 through the XOR gate 110. The only combination not provided by the shift register 100 and the XOR gate 110 is the all zeroes combination.

The all zeroes combination is provided through the shift register 100 in combination with the AND gate 120. The AND gate 120 has as its inputs the complement of the three bit positions 102, 104, and 106 of the shift register 100. Where the three bit positions 102, 104, and 106 each have a zero, the resultant of the AND gate 120 is a one. When the bit position 108 has a one and the three bit positions 102, 104, and 106 each contain a zero, the resultant of the XOR gate 110 is a zero. Thus, a load of a zero into the least significant bit position 102 is performed and the shift register 100 contains all zeroes. In a preferred embodiment, the bit positions 102 through 108 are each initialized with a zero. Thus, in a preferred embodiment, each sequence of addresses commences with all zeroes.

When the shift register 100 contains all zeroes, the resultant of AND gate 120 is still a one. The feedback from the bit positions 108 and 106 are zeroes. As a result, the XOR 110 inputs a one to the bit position 102. Thus, in the clock cycle after all zeroes are loaded into the shift register, a one is loaded into bit position 102. Consequently, the shift register 100, the feedback through the XOR gate 110, the AND gate 120, and the AND gate 122 provide all of the $2^n$ possible addresses. Thus, in system 10 of FIG. 2, sixteen addresses are provided.

The address bits for each of the $2^n$ combinations are provided to the memory 6 through components 112 through 118. Depending on the count in bits 132 through 138 of the counter 130, different groups of bits which form the address are complemented by components 112 through 118. Where bit one 132 is a one, the component 112 complements the bit from bit position 102. Where bit two 134 is a one, the component 114 complements the bit from bit position 104. Where bit three 136 is a one, the component 116 complements the bit from bit position 106. Where bit four 138 is a one, the component 118 complements the bit from bit position 108. Note that in a preferred embodiment, bit zero 131 is not used to control any of components 112 through 118. Instead, bit zero 131 provides a read/write signal.

In a preferred embodiment, the counter 130 is initially set to zero. Because the bits 131 through 138 of the counter 130 are all zero, the components 112 through 118, do not alter the bits from the bit positions 102 through 108, respectively. The address sequence provided to the memory 6 is, therefore, the same address sequence that the shift register 100 provides. In addition, because bit zero 131 is zero, a write signal is initially provided.

When only bit position 108 of the register 100 contains a one, not only are all zeroes loaded into the shift register 100, but the resultant of AND gate 122 is also a one. A load signal is provided to the data generator 30 through AND gate 122. The resultant of AND gate 122 being a one also forces the counter 130 to increment its least significant bit, bit zero 131. As a result, the write signal is switched to a read signal. The same sequence, starting with all zeroes and ending with zeroes in bit positions 102, 104, and 106, and a one in bit position 108, is then repeated in the shift register 100.

The same sequence of addresses is repeated because the same starting seed, all zeroes, is provided. As long as bit positions 102 through 108 have the same starting seed, the same sequence will be repeated. As a result, first a write is accomplished through the address sequence, then a read of the same address sequence is performed.

The read on the same sequence of addresses is completed when only bit position 108 of the shift register 100 is a one. The AND gate 120 then provides a load of the all zero state again. The bit zero 131 of the counter 130 is again incremented by AND gate 122. The bit zero 131 of the counter 130 then provides a write signal and to increment the bit one 132.

Because the bit one 132 is a one, the component 112 provides the complement of the bit from the farthest left bit position 102 of the shift register 100. In a preferred embodiment, the complement is provided through an XOR operation. Because only bit one 132 of the bit one 132 through four 138 is a one, the remaining components 114, 116, and 118 allow the bits from positions 104, 106, and 108 to pass through.

Because the bit from component 112 is the complement of the bit from the bit position 102, an entirely new sequence of addresses is generated. When this sequence of addresses is completed by only bit position 108 being on, bit zero 131 is again incremented and the all zero state is loaded into the shift register 100. A read on the new sequence of addresses is then performed. When all of the bit positions of the shift register 100 except bit position 108 are zero, the counter 130 is again incremented. When the counter 130 is incremented, bit zero 131, bit one 132, and bit two 134 flip.

Because bit one 134 is now on, the component 114 provides the complement of the data from bit position 104 as an address bit. Because bit 132 is off, the component 112 now passes the bit from bit position 102 unchanged. Thus, another new sequence of addresses is generated. This process continues until all five bits 131 through 138 of the bit counter 130 are zero again. Where bit 132, 134, 136, or 138 is a one, component 112, 114, 116, or 118, respectively, provide the complement from bit position 102, 014, 106, or 108, respectively. As a result, a large number of unique address sequences are generated.

Figure 4:
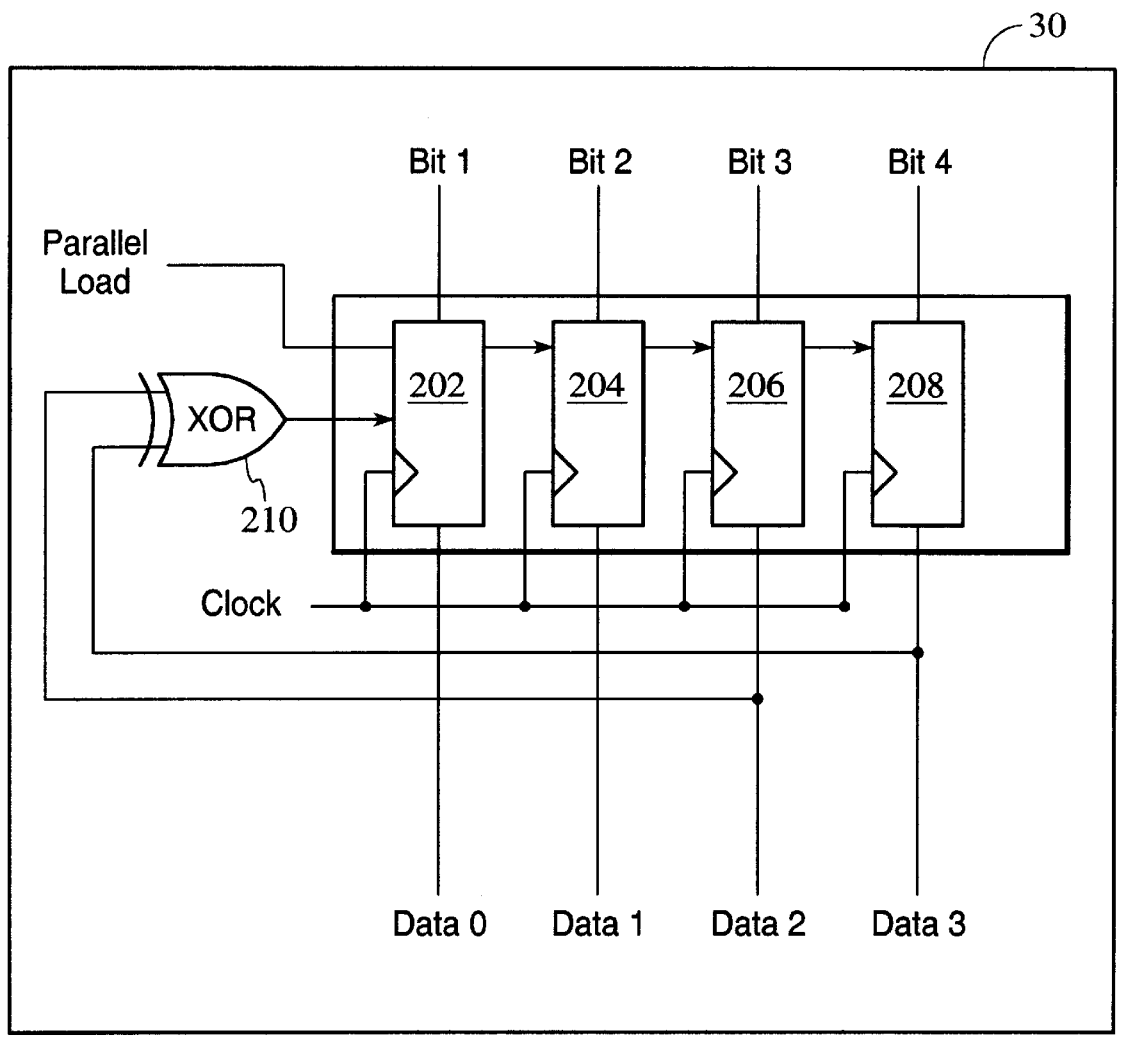
FIG. 4 is a diagram depicting one embodiment of a data generator in accordance with the method and system.

The data generator 30 of one embodiment of the method and system is shown in FIG. 4. The data generator 30 includes a load into the farthest left bit position 202 from the address generator 30. As in the shift register 100 of the address generator 30, the two farthest right bit positions 206 and 208 are fed back through an XOR gate 210 to the farthest left bit position 202. On each clock cycle, the data in bit positions 202 through 208 is shifted to a bit position immediately to the right if a bit position immediately to the right exists. The data is also provided to the memory 6.

The same data sequence is repeated by data generator 30. However, each address sequence, discussed above, is unique. Thus, although the data generator 30 is providing the same sequence, the data are being written into different addresses. Consequently, a large number of test patterns are provided. Assuming that n is the number of address bits, and m is the number of data bits, the pattern generator will not repeat the same sequence until $2*(2^n)(2^m)$ for m greater than n, and $2*(2^{2n})$ for n greater than m.

For larger n, the burn-in cycle could be completed without repeating the same pattern through the burn-in. For example, for a 16 megabit DRAM organized as 4 megabits by 4, the sequence would not repeat for $2*(2^{44})$ cycles. For a 50 nanosecond cycle time, the pattern would not be repeated for four hundred and eighty eight hours. A typical burn-in cycle takes approximately twenty four hours. As a result, this feature provides significantly enhanced testing capability.

This large number of patterns is generated using relatively little additional circuitry. Because of the low overhead of hardware required, the system 10 could also be used to test and burn in memory elements that are embedded in logic.

Because each address sequence provides both a read and a write, the comparator 40 of FIG. 2 can immediately flag any failures. Thus, additional steps to find an error, such as comparing signatures from a MISR, are not required. In addition, even though a very large number of sequences can be tested, the sequence is repeatable. Because the sequence is repeatable, diagnosis of fails is made simpler. After a fail is found a user can project where the n bit counter was at the time of the fail. Thus, a user can recreate the fail conditions almost immediately and diagnose any problems in the memory 6.

A method and system has been disclosed for providing a significantly greater number of unique patterns for testing during memory burn-in. The additional patterns are also provided without requiring substantial additional circuitry.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An address generator comprising:
   shift register means, the shift register means including n bit positions, the n bit positions for storing n bits and shifting the n bits out of the shift register, the n bits being capable of being in a plurality of patterns;
   counter means coupled to the shift register means, the counter means having a value that is incremented in response to a particular pattern of the plurality of patterns; and
   complement means coupled to the shift register means and the counter means, the complement means for providing a complement of at least a portion of the n bits shifted out of the shift register in response to the value in the counter means.

2. The address generator of claim 1 wherein the shift register means further comprises:
   an input coupled to a first bit position of the n bit positions; and
   feedback means coupled to the input, the feedback means for providing a function of a second bit position and a third bit position of the n bit positions to the input.

3. The address generator of claim 2 wherein the counter means further comprise n+1 bit positions; and wherein the counter means further provides a read/write signal.

4. The address generator of claim 3 further comprising:

all zero means coupled to the shift register means and the counter means, the all zero means for allowing the shift register means to hold a zero in each of the n bit positions and for incrementing the value in the counter means in response to the particular pattern, the all zero means for further allowing a one to be loaded into the first bit position.

5. The address generator of claim 4 wherein the particular pattern of bits is a bit in the farthest right bit position of the n bit positions being a one and each remaining bit of the n bits being a zero.

6. The address generator of claim 5 wherein the function of the second bit position and the third bit position is an exclusive or; the second bit position is the farthest right bit position; and the third bit position is a next furthest right bit position.

7. The address generator of claim 6 wherein the complement means provides the complement of a bit position of the shift register means if a corresponding bit in the counter means is a one.

8. A system for providing testing during burn-in of a memory comprising:

an address generator comprising:
shift register means, the shift register means including n bit positions, the n bit positions for storing n bits and shifting the n bits out of the shift register, the n bits being capable of being in a plurality of patterns;
counter means coupled to the shift register means, the counter means having a value that is incremented in response to a particular pattern of the plurality of patterns; and
complement means coupled to the shift register means and the counter means, the complement means for providing a complement of at least a portion of the n bits shifted out of the shift register in response to the value in the counter means;

a data generator coupled to the address generator and the memory; and compare circuitry coupled to the memory and the data generator;

wherein a fail is detected when data from the data generator does not match data read from the memory.

9. The system of claim 8 wherein the shift register means further comprises:

an input coupled to a first bit position of the n bit positions; and feedback means coupled to the input, the feedback means for providing a function of a second bit position and a third bit position of the n bit positions to the input.

10. The system of claim 9 wherein the counter means further comprise n+1 bit positions; and wherein the counter means further provides a read/write signal.

11. The system of claim 10 wherein the address generator further comprises:

all zero means coupled to the shift register means and the counter means, the all zero means for allowing the shift register means to hold a zero in each of the n bit positions and for incrementing the value in the counter means in response to the particular pattern, the all zero means for further allowing a one to be loaded into the first bit position.

12. The system of claim 11 wherein the particular pattern of bits is a bit in the farthest right bit position of the n bit positions being a one and each remaining bit of the n bits being a zero.

13. The system of claim 12 wherein the function of the second bit position and the third bit position is an exclusive or; the second bit position is the farthest right bit position; and the third bit position is a next furthest right bit position.

14. The system of claim 13 wherein the complement means provides the complement of a bit position of the shift register means if a corresponding bit in the counter means is a one.

15. The system of claim 14 wherein the data generator provides m bits of data in each data set.

16. The system of claim 15 wherein the data generator further comprises:

m bit shift register means, the m bit shift register means including an input; and exclusive or ("XOR") means coupled m bit shift register means, the XOR means for providing an exclusive or of a most significant bit and a next most significant bit of the m bit shift register to the input to the m bit shift register means.

17. A method for providing an address generator comprising the steps of:

providing shift register means, the shift register means including n bit positions, the n bit positions for storing n bits and shifting the n bits out of the shift register, the n bits being capable of being in a plurality of patterns;

providing counter means coupled to the shift register means, the counter means having a value that is incremented in response to a particular pattern of the plurality of patterns; and providing complement means coupled to the shift register means and the counter means, the complement means for providing a complement of at least a portion of the n bits shifted out of the shift register in response to the value in the counter means.

18. The method of claim 17 wherein the step of providing shift register means further comprises the steps of:

providing an input coupled to a first bit position of the n bit positions; and providing feedback means coupled to the input, the feedback means for providing a function of a second bit position and a third bit position of the n bit positions to the input.

19. The method of claim 2 wherein the counter means further comprise n+1 bit positions; and wherein the counter means further provides a read/write signal.

20. The method of claim 19 further comprising the steps of:

providing all zero means coupled to the shift register means and the counter means, the all zero means for allowing the shift register means to hold a zero in each of the n bit positions and for incrementing the value in the counter means in response to the particular pattern, the all zero means for further allowing a one to be loaded into the first bit position.

21. The method of claim 20 wherein the particular pattern of bits is a bit in the farthest right bit position of the n bit positions being a one and each remaining bit of the n bits being a zero.

22. The method of claim 21 wherein the function of the second bit position and the third bit position is an exclusive or; the second bit position is the farthest right bit position; and the third bit position is a next furthest right bit position.

23. The method of claim 22 wherein the complement means provides the complement of a bit position of the shift register means if a corresponding bit in the counter means is a one.

24. A method for providing testing during burn-in of a memory comprising the steps of:

provided an address generator, the step of providing an address generator further comprising the steps of:

providing shift register means, the shift register means including n bit positions, the n bit positions for storing n bits and shifting the n bits out of the shift register, the n bits being capable of being in a plurality of patterns;

providing counter means coupled to the shift register means, the counter means having a value that is incremented in response to a particular pattern of the plurality of patterns; and providing complement means coupled to the shift register means and the counter means, the complement means for providing a complement of at least a portion of the n bits shifted out of the shift register in response to the value in the counter means;

providing a data generator coupled to the address generator and the memory; and providing compare circuitry coupled to the memory and the data generator;

wherein a fail is detected when data from the data generator does not match data read from the memory.

25. The method of claim 24 wherein the step or providing a shift register means further comprises the steps of:

providing an input coupled to a first bit position of the n bit positions; and providing feedback means coupled to the input, the feedback means for providing a function of a second bit position and a third bit position of the n bit positions to the input.

26. The method of claim 25 wherein the counter means further comprise n+1 bit positions; and wherein the counter means further provides a read/write signal.

27. The method of claim 25 wherein the step of providing an address generator further comprises the step of:

providing all zero means coupled to the shift register means and the counter means, the all zero means for allowing the shift register means to hold a zero in each of the n bit positions and for incrementing the value in the counter means in response to the particular pattern, the all zero means for further allowing a one to be loaded into the first bit position.

28. The method of claim 27 wherein the particular pattern of bits is a bit in the farthest right bit position of the n bit positions being a one and each remaining bit of the n bits being a zero.

29. The method of claim 28 wherein the function of the second bit position and the third bit position is an exclusive or; the second bit position is the farthest right bit position; and the third bit position is a next furthest right bit position.

30. The method of claim 29 wherein the complement means provides the complement of a bit position of the shift register means if a corresponding bit in the counter means is a one.

31. The method of claim 30 wherein the data generator provides m bits of data in each data set.

32. The method of claim 31 wherein the step of providing the data generator further comprises the steps of:

providing m bit shift register means, the m bit shift register means including an input; and providing exclusive or ("XOR") means coupled m bit shift register means, the XOR means for providing an exclusive or of a most significant bit and a next most significant bit of the m bit shift register to the input to the m bit shift register means.

* * * * *